United States Patent
Nishimura (10) Patent No.: US 7,432,515 B2
(45) Date of Patent: Oct. 7, 2008

(54) CHARGED PARTICLE BEAM LITHOGRAPHY APPARATUS AND METHOD

(75) Inventor: Shinsuke Nishimura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 277 days.

(21) Appl. No.: 11/337,501

(22) Filed: Jan. 24, 2006

(65) Prior Publication Data

US 2006/0192143 A1   Aug. 31, 2006

(30) Foreign Application Priority Data

Jan. 24, 2005   (JP) .............................. 2005-015250

(51) Int. Cl.
*H01J 37/304* (2006.01)
(52) U.S. Cl. .............................. 250/492.23; 250/491.1; 250/492.22
(58) Field of Classification Search ............... 250/491.1
See application file for complete search history.

(56) References Cited

U.S. PATENT DOCUMENTS 4,321,510 A * 3/1982 Takigawa ................... 315/382
4,524,277 A * 6/1985 Shimura et al. ............. 250/397
4,939,371 A * 7/1990 Goto .......................... 250/397

FOREIGN PATENT DOCUMENTS

JP           09-063937           3/1997

* cited by examiner

*Primary Examiner*—Jack I Berman
(74) *Attorney, Agent, or Firm*—Finnegan, Henderson, Farabow, Garrett & Dunner, L.L.P.

(57) ABSTRACT

A charged particle beam lithography apparatus includes a charged particle beam generation source; a charged particle beam forming portion through which the charged particle beam is transmitted; a first deflector arranged between the charged particle beam forming portion and the charged particle beam generation source; a second deflector arranged between the first deflector and the charged particle beam forming portion; an imaging unit obtaining image data of the aperture; and a control portion calculating amounts of excitation of the first and second deflector based on the image data. The charged particle beam is deflected by the first deflector to intersect the optical axis. The deflected charged particle beam is deflected by the second deflector to advance on the optical axis. The control portion controls the first and second deflectors based on the calculated amounts of excitation.

18 Claims, 8 Drawing Sheets

CHARGED PARTICLE BEAM LITHOGRAPHY APPARATUS AND METHOD

CROSS-REFERENCE TO RELATED APPLICATION

This application is based on and claims the benefit of priority from the prior Japanese Patent Application No 2005-015250, filed on Jan. 24, 2005; the entire contents of which are incorporated herein by reference.

BACKGROUND OF THE INVENTION

1. Field of the Invention

The present invention relates to a charged particle beam lithography apparatus and method which can form a charged particle beam emitted from an electron gun in a desired beam shape and performs lithography by irradiating the charged particle beam on a test piece.

2. Description of the Related Art

Figure 9:
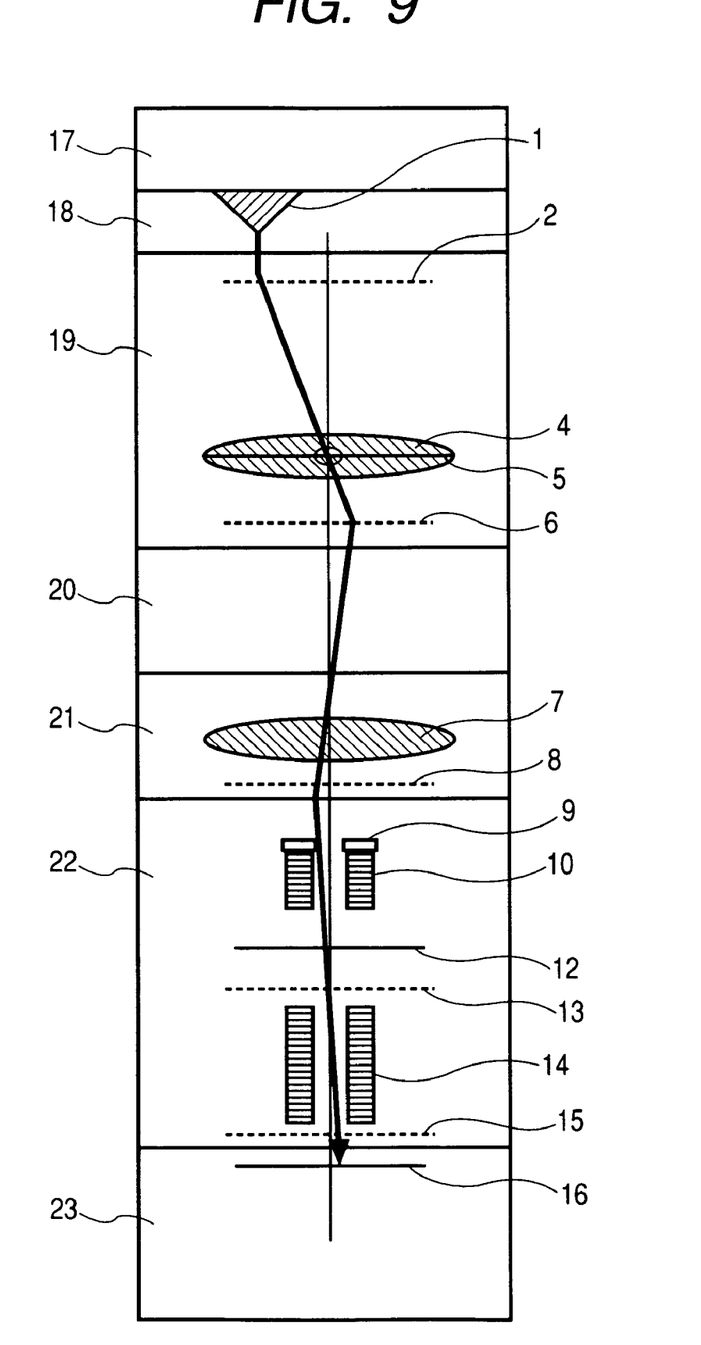
FIG. 9 is a configuration view showing a charged particle beam lithography apparatus according to a related art.

FIG. 9 shows a configuration view of a charged particle beam lithography apparatus according to a related art. (e.g., see JP-A-9-63937) On an advancing path (that is, on one optical axis) of a charged particle beam emitted from an electron gun 1, a charged particle beam forming portion, that is, a first illumination lens 4, a beam limitation aperture 5, which is provided so that the center thereof corresponds to the center of the first illumination lens, a second illumination lens 7 and a first forming aperture 16 are arranged, and further downstream, a first projection lens, a forming deflector, a second projection lens, a second forming aperture, a reduced lens and an objective lens and the like are arranged. The charged particle beam is formed by the charged particle beam forming portion to be irradiated on a test piece.

A first alignment deflector 2 is provided between the electron gun 1 and the first illumination lens 4. A third alignment deflector 6 is provided between the first illumination lens 4 and the second illumination lens 7. Further, at the downstream of the second illumination lens 7, a fourth alignment deflector 8, a blanking deflector upper pole aperture (a first blanking aperture) 9, a blanking deflector upper pole 10, a blanking aperture (a second blanking aperture) 12, a fifth alignment deflector 13, a blanking deflector lower pole 14, a sixth alignment deflector 15 and a first forming aperture 16 are provided in this order.

According to such a configuration, the charged particle beam emitted from the electron gun 1, that is, a crossover image is formed five times by the first illumination lens 4, the second illumination lens 7, the first projection lens, the second projection lens and the reduced lens, and finally, is formed on a main surface of the objective lens. In addition, the charged particle beam emitted from the electron gun 1 passes through the first forming aperture 16, and then is deflected by the forming deflector to pass through the second forming aperture. Thus, the charged particle beam is formed in an aperture shape which combines the first forming aperture with the second forming aperture. Thereafter, the formed charged particle beam is imaged on a surface of the test piece by the reduced lens and the objective lens.

In the upstream of the charged particle beam lithography apparatus as such a configuration, the center of the beam limitation aperture 5 in the first illumination lens 4 has been referenced, the first alignment deflector 2 has been controlled so that the beam emitted from the electron gun 1 passes through the center.

On the other hand, the charged particle beam lithography apparatus is configured in such a way that from the electron gun 1 to a position, where the first forming aperture 16 is fixed, is divided into seven blocks and outer cylinders corresponding to the respective blocks are stacked. The blocks 1 to 7 respectively mainly include a part (parts) as described below.

Block 1 (17): electron gun 1
Block 2 (18): chamber housing electron gun 1
Block 3 (19): first alignment deflector 2, first illumination lens 4, beam limitation aperture 5 and third alignment deflector 6
Block 4 (20): outer cylinder connecting block 3 with block 5
Block 5 (21): second illumination lens 7, fourth alignment deflector 8
Block 6 (22): blanking deflector upper pole aperture 9, blanking electrode upper pole 10, blanking aperture 12, fifth alignment deflector 13, blanking deflector lower pole 14 and sixth alignment deflector 15
Block 7 (23): first forming aperture 16

Outer cylinders of these blocks are designed with precision of tens μm of tolerance, reference of a radius direction between blocks becomes a fitting portion of the outer cylinder. Pole pieces, deflectors and apertures are fixedly positioned via a plurality of components based on these blocks.

In such a device, once blocks located downstream from the block 1 (17) are assembled, it is needless to disassemble them as long as a breakdown is not found, therefore, the blocks are assembled with high tolerance.

However, because the electron gun 1 is a consumable, after it is used for a certain period, it is exchanged for another electron gun. Therefore, it is required that the block 1 (17), in which the electron gun 1 is arranged, is configured so as to be easily opened/shut, and it is difficult to make the precision of assembling tighter in comparison with the other blocks. Further, it is difficult to improve the precision of a position and direction of the beam emitted from the electron gun 1. In such circumstances, a condition, where the emitting position or emitting direction of the beam emitted from the electron gun 1 is likely to deviate from the center axis of the device, unavoidably occurs.

In such a case, even though the first alignment deflector 1 is controlled so that the beam emitted from the electron gun 1 passes through the center of the beam limitation aperture 5 in the first illumination lens 4, as shown in FIG. 9, the axis deviation at the upstream of the device reoccurs at the downstream, the beam approaches the structures located downstream, the possibility that the beam is shielded increases, therefore, there remains a problem such that a beam defect or a beam blur is likely to arise and precise lithography cannot be performed.

SUMMARY OF THE INVENTION

The present invention has been made in view of the above circumstances and provides a charged particle beam lithography apparatus and method which can perform beam adjustment to prevent a beam defect and a beam blur by compensating an axis deviation of a charged particle beam with a positional deviation of a charged particle beam generation source, and of performing high precision lithography for a test piece.

According to an aspect of the invention, a charged particle beam lithography apparatus performing lithography by irradiating a charged particle beam on a test piece, comprising:

a charged particle beam generation source;
a charged particle beam forming portion including a lens and an aperture, which are arranged on an optical axis and through which the charged particle beam emitted from the charged particle beam generation source is transmitted;

a first deflector that is arranged between the charged particle beam forming portion and the charged particle beam generation source and that deflects the charged particle beam emitted from the charged particle beam generation source;

a second deflector that is arranged between the first deflector and the charged particle beam forming portion and that deflects the charged particle beam deflected by the first deflector;

an imaging unit that obtains image data of the aperture; and a control portion that calculates amounts of excitation of the first and second deflector based on the obtained image data so that the charged particle beam emitted from the charged particle beam generation source is deflected by the first deflector to intersect the optical axis and the charged particle beam deflected by the first deflector is deflected by the second deflector to advance on the optical axis, and that controls the first and second deflectors based on the calculated amounts of excitation.

According to the above-aspect, the charged particle beam lithography apparatus can compensate an axis deviation of a charged particle beam at the upstream of the device with an axis deviation of an emitting position, reduce an amount of an axis deviation at the downstream of the device, emit direction of a charged particle beam generation source, perform beam adjustment to prevent a beam defect and a beam blur, and perform high precision lithography.

BRIEF DESCRIPTION OF THE DRAWINGS

These and other objects and advantages of this invention will become more fully apparent from the following detailed description taken with the accompanying drawings in which.

DESCRIPTION OF THE EMBODIMENTS

Figure 1:
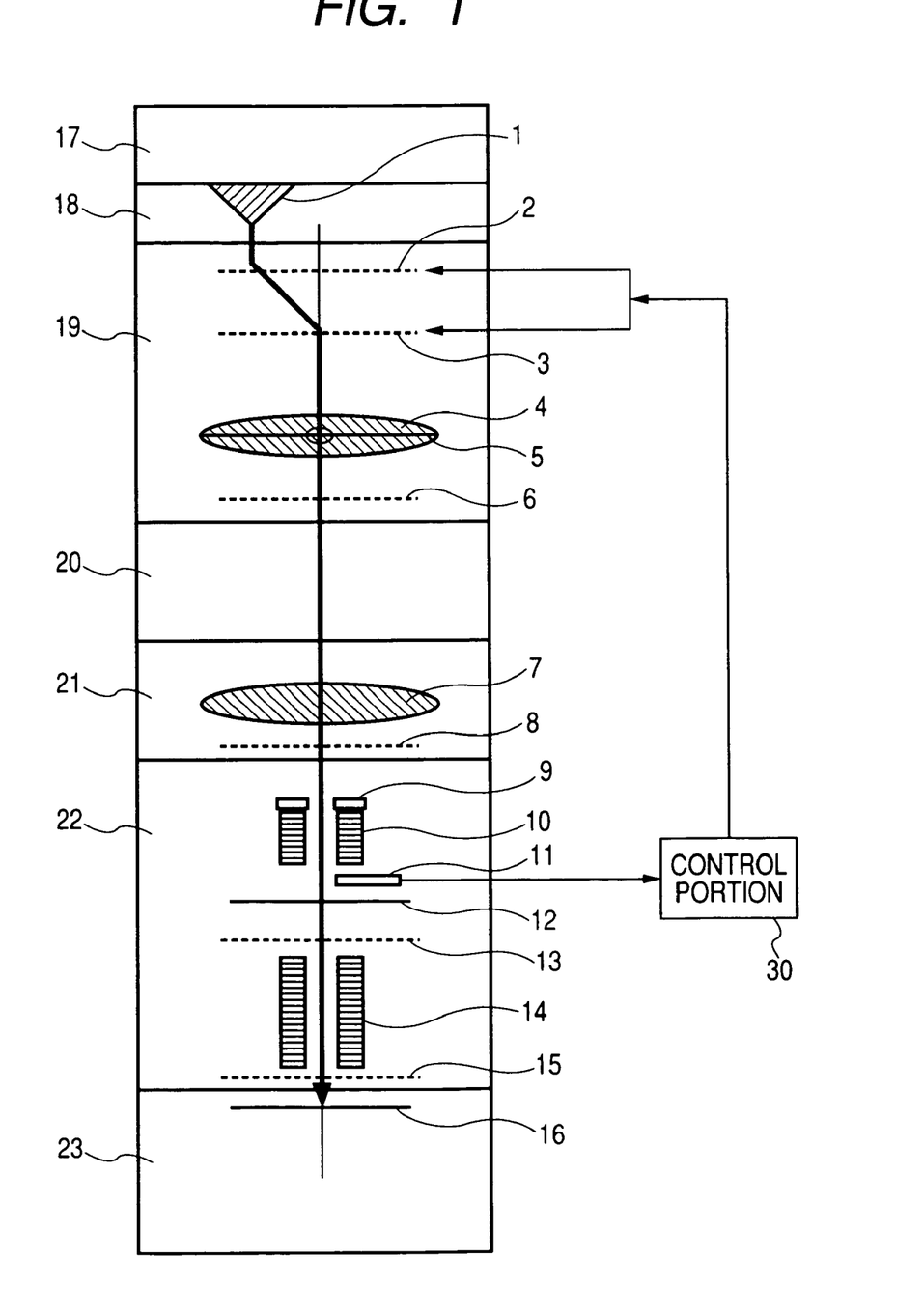
FIG. 1 is a configuration view showing a charged particle beam lithography apparatus according to an embodiment.

An embodiment of the present invention is described below with reference to the accompanying drawings. FIG. 1 shows a configuration view of a charged particle beam lithography apparatus according to the present invention. Moreover, in FIG. 1, the same numerals are attached to the same parts in FIG. 9, and detailed description of the same parts will be omitted.

On an advancing path (that is, on one optical axis) of a charged particle beam emitted from an electron gun 1 as a charged particle beam generation source, a charged particle beam forming portion, that is, a first illumination lens 4 and a beam limitation aperture 5 provided so that the center thereof corresponds to the center of the first illumination lens 4, a second illumination lens 7 and a first forming aperture 16 are arranged, and further downstream, a first projection lens, a forming deflector, a second projection lens, a second forming aperture, a reduced lens and an objective lens and the like are arranged. The charged particle beam is formed by the charged particle beam forming portion to be irradiated on a test piece.

A third alignment deflector 6 is provided between the first illumination lens 4 and the second illumination lens 7. At the downstream of the second illumination lens 7, a fourth alignment deflector 8, a blanking deflector upper pole aperture (a first blanking aperture) 9, a blanking deflector upper pole 10, a blanking aperture (a second blanking aperture) 12, a fifth alignment deflector 13, a blanking deflector lower pole 14, a sixth alignment deflector 15 and a first forming aperture 16 are provided in this order.

A gap of the blanking deflector upper pole 10 and a gap of the blanking deflector lower pole 14 are made narrow so that the deflection sensitivity is raised. For, example, it is approximately 2 mm. An upper plate (blanking deflector upper pole aperture) 9 with a hole with a diameter of 2 mm is provided on an upper portion of the blanking deflector upper pole 10 so that the beam does not contact with an electrode. It is required that the beam passes through the hole with the diameter of 2 mm with room to spare. The blanking deflector upper pole 10 and the blanking deflector upper pole aperture 9 are fixed to a blanking holder, assembling tolerance of a radius direction is approximately 10 μm based on an outer diameter of the holder.

The charged particle beam lithography apparatus includes two deflectors, a first alignment deflector 2 and a second alignment deflector 3 in order from the electron gun 1 side, between the electron gun 1 and the first illumination lens 4.

Further, in the charged particle beam lithography apparatus, a beam detector (imaging device) 11 is provided between the blanking deflector upper pole 10 and the blanking aperture 12, the detector 11 detects a reflected beam, which reflects by an upper surface of the blanking aperture 12 without transmitting through the aperture 12. A detected signal is transmitted to a control portion 30 as measurement image data.

The control portion 30 is configured by a computer system, and is connected to the first alignment deflector 2 and the second alignment deflector 3. The control portion 30 has a calculation unit for calculating amounts of excitation of the first alignment deflector 2 and the second alignment deflector 3 based on the measurement image data of the beam reflected by the blanking aperture 12 which is detected by the beam detector 11. Further, the control portion 30 has a deflector control unit for generating an instruction to the first alignment deflector 2 and the second alignment deflector 3 in accordance with the calculated amounts of excitation.

The charged particle beam lithography apparatus is configured in such a way that from the electron gun 1 to a position where the first forming aperture 16 is fixed, is divided into seven blocks and outer cylinders corresponding to the respective blocks are stacked. The blocks 1 to 7 respectively mainly include a part as described below.

Block 1 (17): electron gun 1

Block 2 (18): chamber housing electron gun 1

Block 3 (19): first alignment deflector 2, second alignment deflector 3, first illumination lens 4, beam limitation aperture 5 and third alignment deflector 6

Block 4 (20): outer cylinder connecting block 3 with block 5

Block 5 (21): second illumination lens 7, fourth alignment deflector 8

Block 6 (22): blanking deflector upper pole aperture 9, blanking electrode upper pole 10, beam detector (imaging device) 11, blanking aperture 12, fifth alignment deflector 13, blanking deflector lower pole 14 and sixth alignment deflector 15

Block 7 (23): first forming aperture 16

As described above, because the electron gun 1 is a consumable, after it is used for a certain period, it is exchanged for another electron gun. It is required that the block 1 (17), in which the electron gun 1 is arranged, is configured so as to be easily opened/shut, therefore, it is difficult to make the precision of assembling tighter. Further, it is difficult to improve the precision of the beam emitted from the electron gun 1 in terms of position and direction. The first alignment deflector 2 and the second alignment deflector 3 are provided so as to compensate the axis deviation.

That is, in the charged particle beam lithography apparatus, when a deviation between the electron gun 1 and the structures located downstream occurs as shown in FIG. 1, alignment is performed so that the beam does not obliquely advance in the downstream. At this time, the control portion 30 controls the first alignment deflector 2 to deflect the charged particle beam emitted from the charged particle beam generation source so that the emitted charged particle beam intersects the optical axis, and controls the second alignment deflector 3 to deflect the charged particle beam deflected by the first alignment deflector 2 so that the deflected charged particle beam advances on the optical axis. Thus, the deviation of the emitting position or emitting direction of the beam can be compensated at the upstream. At this time, as described in the following concrete example, it is desirable that the control portion 30 determines amounts of deflection of the first and second deflectors to make the beam pass through the beam limitation aperture 5 and the center of the blanking deflector upper pole aperture 9 or the center of the blanking aperture 12 located downstream further than the aperture 5.

An example of the operation of the charged particle beam lithography apparatus by the control portion 30 is further described below.

<1. Initial Beam Adjustment>

In an initial state that alignment is not performed, there is a possibility that the beam does not pass through the beam limitation aperture 5 owing to the deviation of emission of the beam, and there is a possibility that nothing is detected by the beam detector 11. When nothing is detected by the beam detector 11, first, the control portion 30 operates the first alignment deflector 2 and the second alignment deflector 3 in turn to find an image of the beam limitation aperture 5. When the beam passes through the beam limitation aperture 5, the detected image brightens, therefore, for example, the control portion 30 selects a combination of the excitation of the first alignment deflector 2 and the excitation of the second alignment deflector 3 where the image becomes most bright. Thus, images of the beam limitation aperture 5, the blanking deflector upper pole aperture 9 and the blanking aperture 12 can be detected. At this time, the amounts of excitation of the third alignment deflector 6 and the fourth alignment deflector 8 located downstream, are set to zero, respectively.

<2. Detection of the Center of the Beam Limitation Aperture Image>

Figure 2:
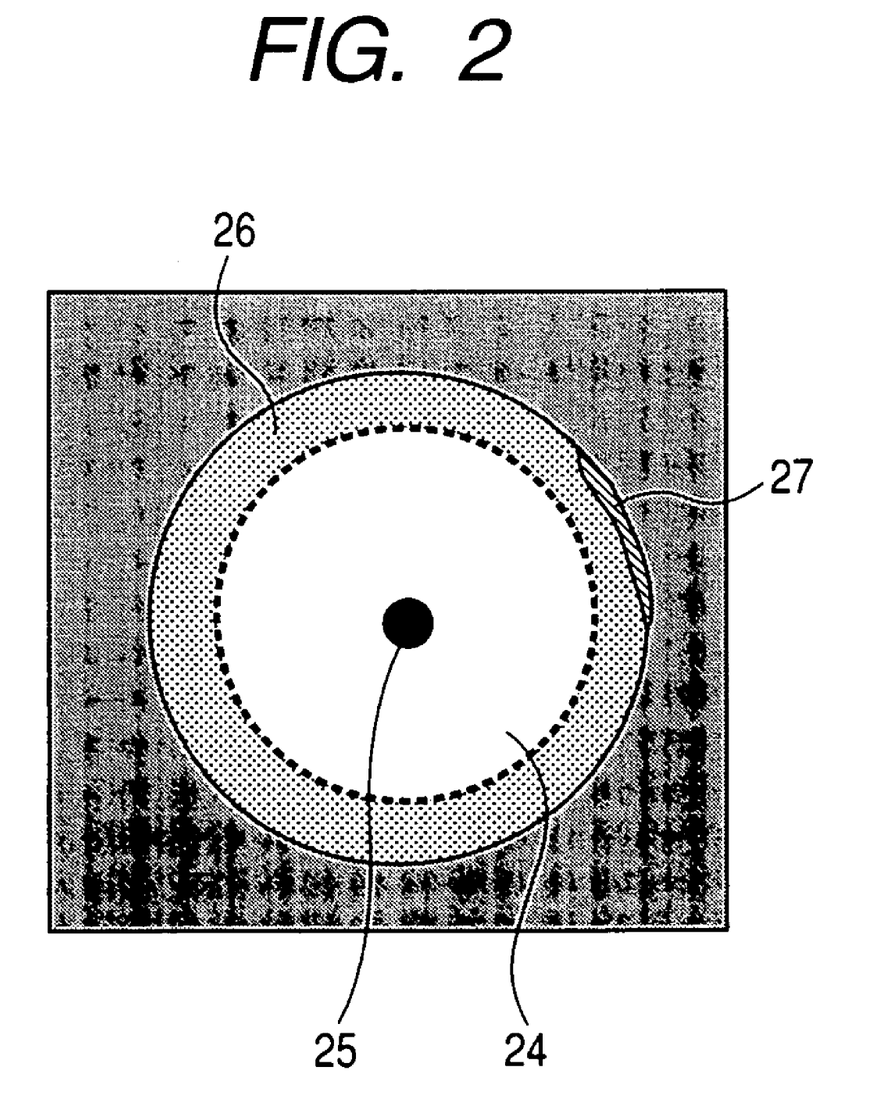
FIG. 2 is a schematic view showing images measured by a beam detector after initial beam adjustment.

FIG. 2 shows an image detected by the beam detector 11 after initial beam adjustment. As shown in FIG. 2, a dark blanking aperture (12) image 25, a bright beam limitation aperture (5) image 24 and a gray blanking deflector upper pole aperture (9) image 26 overlap, and the overlapping image is detected.

The following processings are performed by the calculation unit based on the above detected image.

Figure 3:
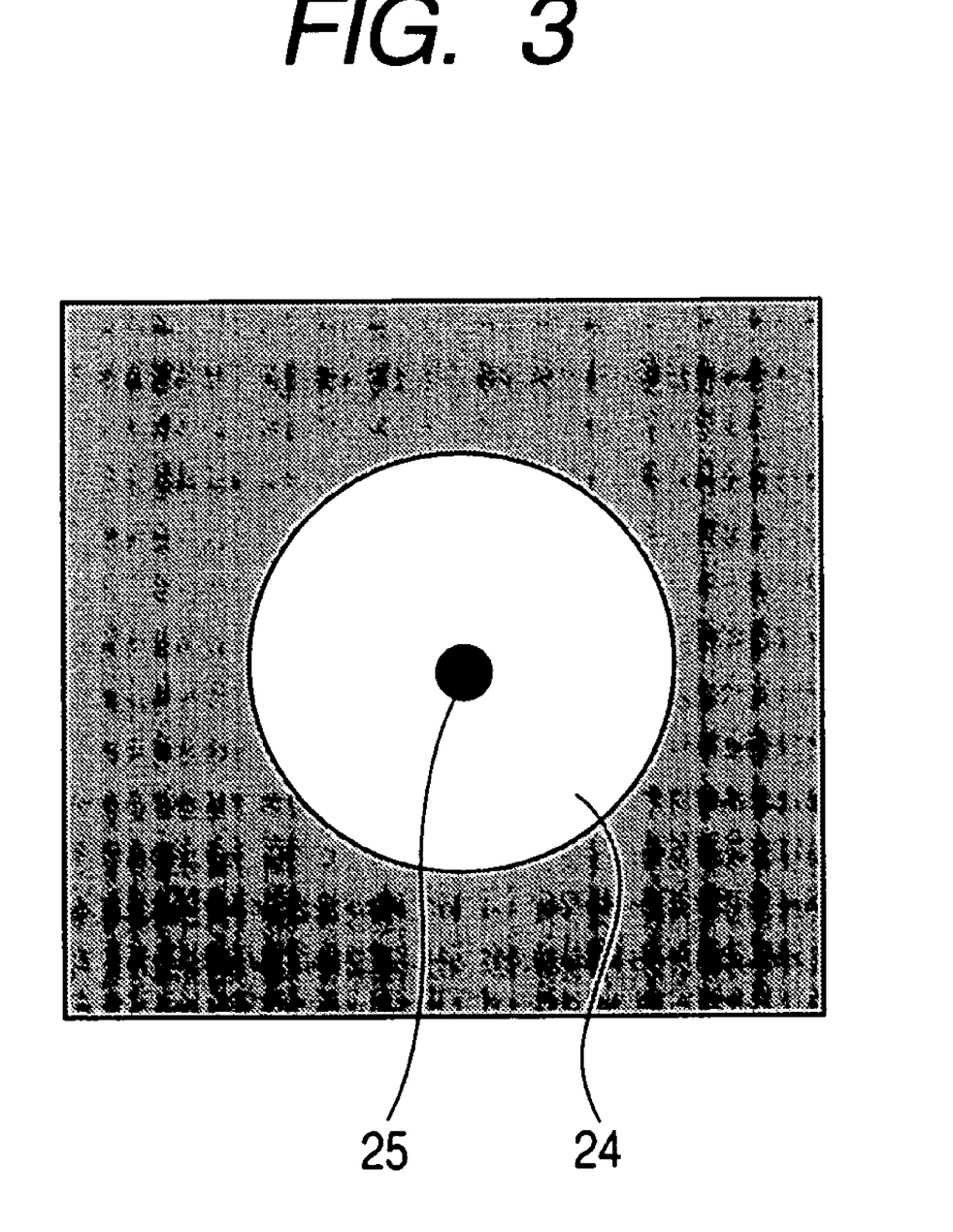
FIG. 3 is a schematic view showing an image after the measured image of FIG. 2 is subjected to binarization.

First, a processing for binarization, which sets up a threshold to the brightness of the images to extract an image having a brightness of the threshold or more, is performed. When a FIG. 27 other than the beam limitation aperture image 24 is detected in the image having a brightness of the threshold or more, the figure is removed. That is, the circularity and area of a figure are measured so as to distinguish figures to be removed, and a figure with a small average circularity figure and a figure with a small area are removed. An image after these processings are performed is shown in FIG. 3. Thus, the beam limitation aperture image 24 can be obtained, however, the dark blanking aperture image 25 overlaps with the image 24.

Although it is preferable that the blanking aperture image 25 can be avoided by exciting the fourth alignment deflector 8, if the blanking aperture image 25 is not avoidable owing to insufficient deflection sensitivity of the deflector 8, the obtained image is converted to an assumed image without a blanking aperture 12.

An example of a method for converting the beam limitation aperture image 24 shown in FIG. 3 to the assumed image without blanking aperture 12 is described below.

Figure 4:
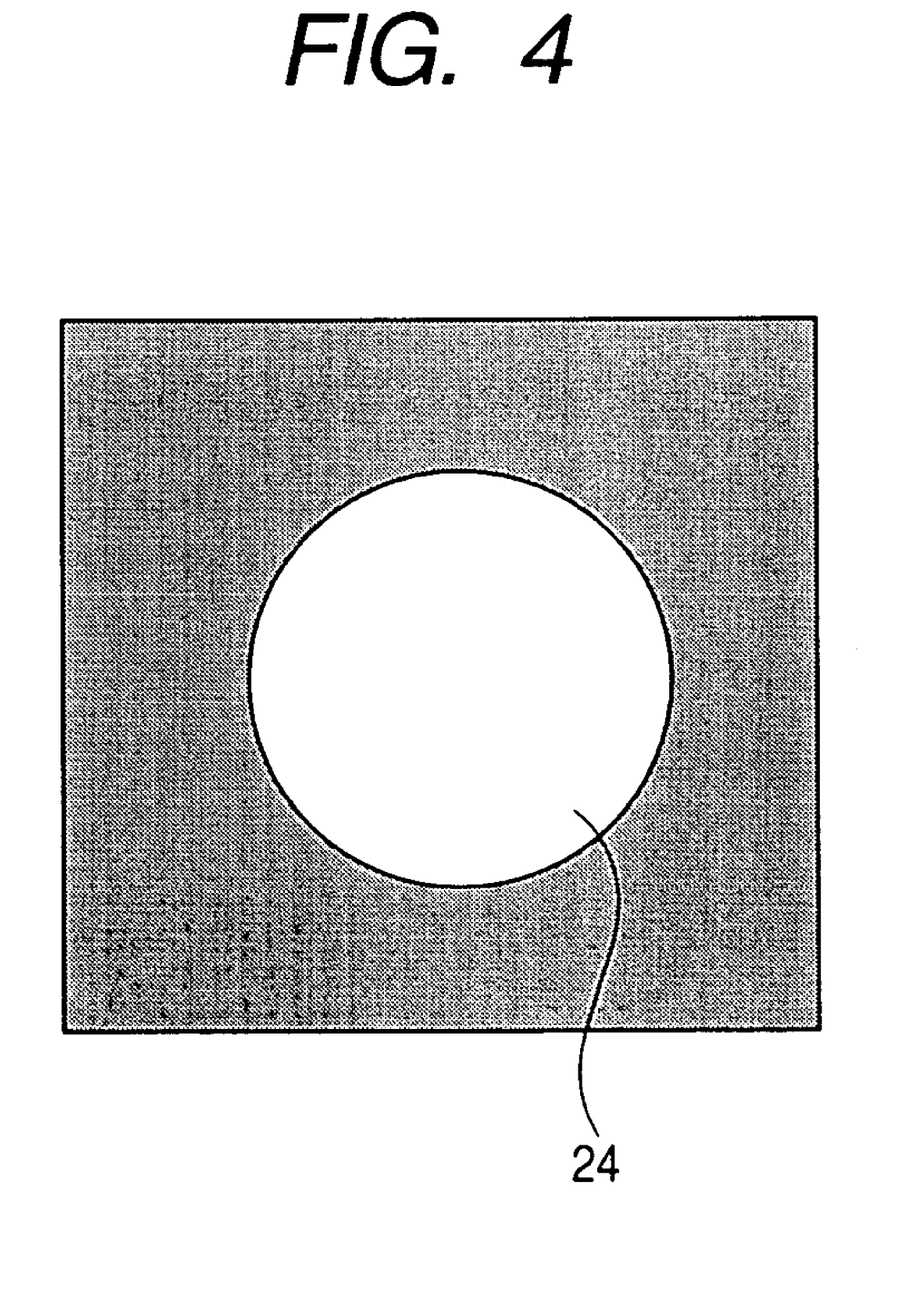
FIG. 4 is a schematic view showing an image obtained by converting the image of FIG. 3 to an assumed image without a blanking aperture.

First, an threshold is set so that the blanking aperture image 25 is extracted. Then, an average value of the brightness of the beam limitation aperture image 24 in the periphery of the image 25 is embedded into the position of the as extracted blanking aperture image 25. Instead, the brightness of extracted blanking aperture image 25 may be kept the same as the brightness of the beam limitation aperture image 24 in periphery of the image 25 without averaging. As a result of such processing, a beam limitation aperture assumed image without a blanking aperture (an obtained beam limitation aperture image 24') is shown in FIG. 4.

Figure 5:
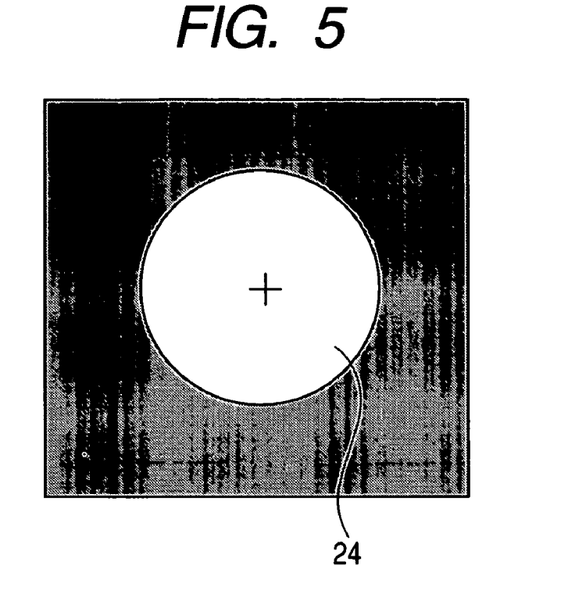
FIG. 5 is a schematic view showing an image that the image shown in FIG. 4 and determined center thereof are shown together.

The obtained beam limitation aperture image 24' is considered as a real beam limitation aperture image. Then, a center of gravity of the image is determined. When the aperture is circular, coordinate data of the circle is calculated, a center position of the circle having a radius and position, which best overlap with a thin line, is determined. FIG. 5 is a view illustrating by overlapping the obtained beam limitation aperture image 24' with the determined center position.

<3. Detection of the Center of the Blanking Aperture Image and the Center of the Blanking Deflector Upper Pole Aperture Image>

Figure 6:
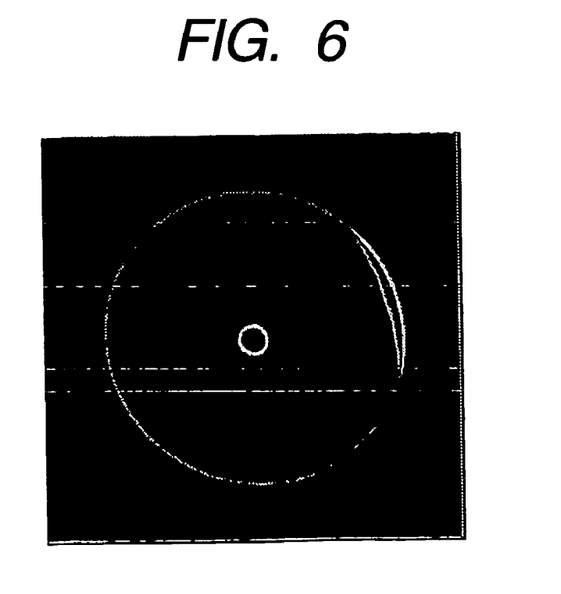
FIG. 6 is a schematic view showing an image determined by differentiating or taking a differences regarding the images shown in FIG. 2.

On the other hand, the images shown in FIG. 2 are differentiated, or, differences of the image are determined, the result of which is shown in FIG. 6. As shown in FIG. 6, contours of a blanking aperture image (inner side) and a blanking deflector upper pole aperture image (outer side) appear.

An appropriate threshold to further extract contours of these images is set and these images are subjected to binarization. The extracted contours are shown in FIG. 7.

Figure 7:
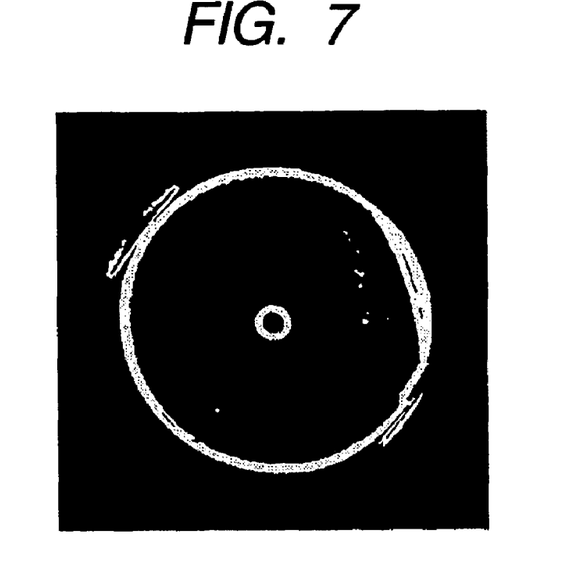
FIG. 7 is a schematic view showing an image after subjecting the image shown in FIG. 6 to binarization.
Figure 8:
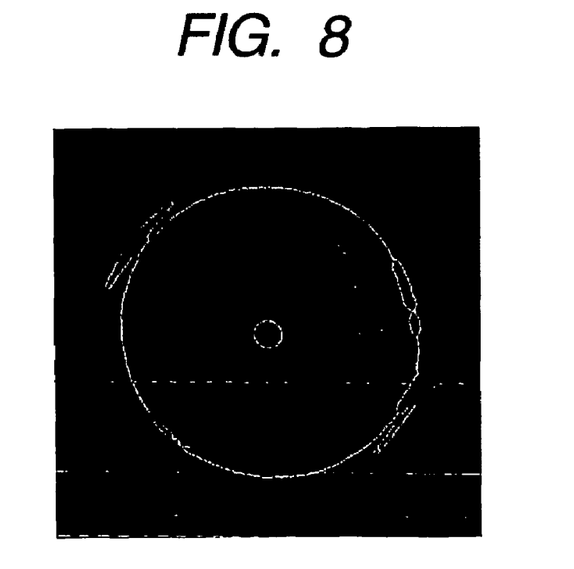
FIG. 8 is a schematic view showing an image after thinning line processing of the image shown in FIG. 7.

When the contour lines are thick as shown in FIG. 7, the thick contour lines are thinned by use of a method used for general image data processing. The thinned contour lines are shown in FIG. 8.

Next, each center of gravity of the obtained blanking aperture image and blanking deflector upper pole aperture image is determined. When the aperture is circular, a coordinate data of the circle is calculated, a center position of the circle having a radius and position which best overlap with the thin lines is determined.

<Calculation and Control of the Amounts of Excitation of the First and Second Alignment Deflectors>

Three center positions of the beam limitation aperture image, blanking aperture image and blanking deflector upper pole aperture image can be determined by the above operation. Further, amounts of excitation of the first alignment deflector 2 and the second alignment deflector 3 are determined so that at least one center position of the blanking aperture image and blanking deflector upper pole aperture image corresponds to the center position of the beam limitation aperture image in the x and y directions.

In advance of determining the above amount of deflection, it is required that the relationship between a change amount of deflection of the first alignment deflector 2 and each change amount of the position of the aperture images are determined. Further, the same relationship for the second alignment deflector 3 is determined. For example, where the change amount of deflection of the alignment deflector is defined as $\Delta x$ and $\Delta y$, and the change amount of position of the aperture image is defined as $\Delta X$ and $\Delta Y$, it is required that coefficients A, B, C and D as represented by the following formula are determined.

$$\begin{pmatrix} \Delta X \\ \Delta Y \end{pmatrix} = \begin{pmatrix} A & C \\ B & D \end{pmatrix} \begin{pmatrix} \Delta x \\ \Delta y \end{pmatrix}$$ [Formula 1]

When actual change amounts $\Delta X$ and $\Delta Y$ are measured by changing $\Delta x$ and $\Delta y$, four linear equations are established, thus, four coefficients A, B, C and D can be determined. The amounts of excitation of the alignment deflectors in the case that the center positions of the aperture images correspond are determined by changing an amount of deflection of the alignment deflector with use of the determined coefficients.

A deflector control unit transmit an instruction to the first alignment deflector 2 and the second alignment deflector 3 based on the determined amounts of excitation of the first alignment deflector 2 and the second alignment deflector 3. The first alignment deflector 2 and the second alignment deflector 3 deflect a charged particle beam based on the instruction, thus, a beam adjustment with less axis deviation can be performed.

A beam adjustment to the center of the second illumination lens 7 is performed by use of the third alignment deflector 6 after the amounts of excitation of the first alignment deflector 2 and the second alignment deflector 3 are determined. By which, when an axis deviation occurs, a beam adjustment to the center of the blanking aperture 12 may be performed by use of the forth alignment deflector 8.

As described above, two illumination lenses are used, however, the same adjustment can also be applied to the case where only one illumination lens is used. Further, the case where the beam limitation aperture 5 is provided in the first illumination lens 4 is described, however, the beam limitation aperture 5 may be provided in the second illumination lens 7.

Figure 10:
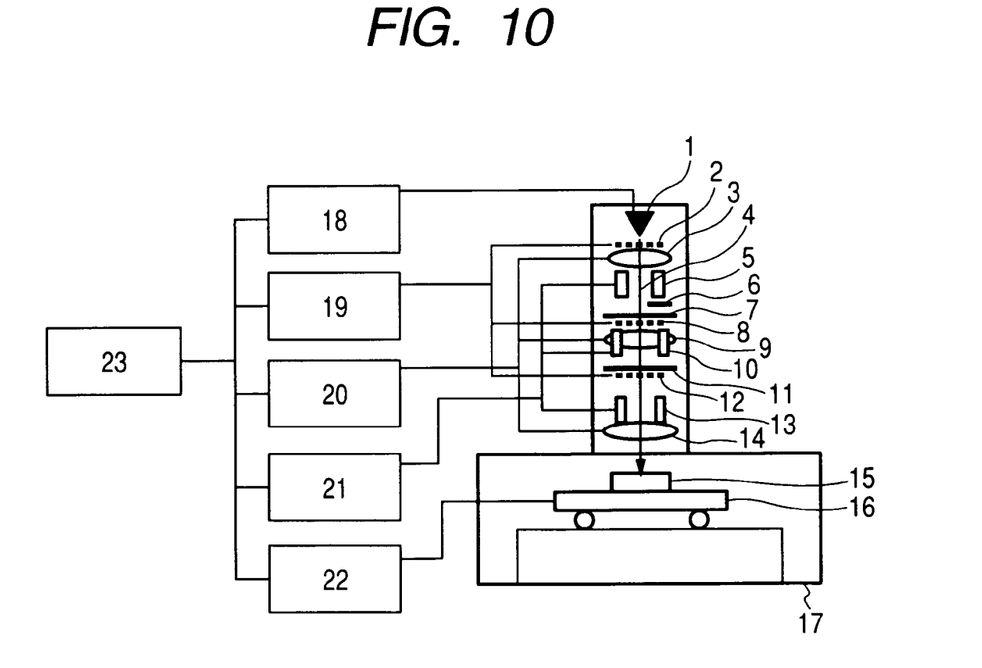
FIG. 10 is an overall view of the charged particle beam lithography apparatus according to the embodiment.

FIG. 10 shows an overall view of the charged particle beam lithography apparatus according to the embodiment. In FIG. 10, a main control apparatus 23 controls the electron gun control-power 18, alignment deflector control-power 19, lens control-power 20, each power of a deflector control-device 21 and a stage control-device 22.

According to the above-embodiment, in the charged particle beam lithography apparatus, at least an illumination lens, a beam limitation aperture, a second illumination lens, a first blanking aperture, a blanking deflector and a second blanking aperture are arranged in this order from the charged particle beam generation source in the charged particle beam forming portion, the imaging unit obtains image data indicating reflection of a charged particle beam from the second blanking aperture, and it is preferable that the control portion has a calculation unit for determining a beam limitation aperture image and a first and second blanking aperture images from the obtained image data, for determining a center position of each image based on the obtained beam limitation aperture image and first and second blanking aperture images, and for calculating amounts of excitation of the first and second deflectors based on the determined center position of each image so that at least one of the center positions of the first and second blanking aperture images corresponds to the center position of the beam limitation aperture image, and has a deflector control unit for controlling the first and second deflectors based on the calculated amounts of excitation.

According to the above-embodiment, the calculation unit emphasizes contours of the aperture images by taking differentials or differences between the obtained beam limitation aperture image and each of the first and second blanking aperture images to determine the center position of the aperture image.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined solely by the following claims and their equivalents.

What is claimed is:

1. A charged particle beam lithography apparatus performing lithography by irradiating a charged particle beam on a test piece, comprising:

a charged particle beam generation source;

a charged particle beam forming portion including a first illumination lens, a beam limitation aperture provided in the first illumination lens, a second illumination lens, a first blanking aperture, a blanking deflector and a second blanking aperture arranged in order from the charged particle beam generation source, and which are arranged on an optical axis and through which the charged particle beam emitted from the charged particle beam generation source is transmitted;

a first deflector that is arranged between the charged particle beam forming portion and the charged particle beam generation source and that deflects the charged particle beam emitted from the charged particle beam generation source;

a second deflector that is arranged between the first deflector and the charged particle beam forming portion and that deflects the charged particle beam deflected by the first deflector;

an imaging unit that obtains image data of the aperture; and a control portion that calculates first amounts of excitation of the first and second deflector based on the obtained image data so that the charged particle beam emitted from the charged particle beam generation source is deflected by the first deflector to intersect the optical axis and the charged particle beam deflected by the first deflector is deflected by the second deflector to advance on the optical axis, and that controls the first and second deflectors based on the calculated first amounts of excitation, wherein the imaging unit obtains image data indicating reflection of the charged particle beam from the second blanking aperture, wherein the control portion has a calculation unit and a deflector control unit, wherein the calculation unit determines a beam limitation aperture image and first and second blanking aperture images from the obtained image data indicating reflection, wherein the calculation unit determines a center position of each of the beam limitation aperture image and first and second blanking aperture images, wherein the calculation unit calculates second amounts of excitation of the first and second deflectors based on the determined center position of each of the beam limitation aperture image and first and second blanking aperture images so that at least one center position of the first and second blanking aperture images corresponds to the center position of the beam limitation aperture image, and wherein the deflector control unit controls the first and second deflectors based on the calculated second amounts of excitation.

2. The charged particle beam lithography apparatus according to claim 1, wherein the calculation unit emphasizes contours of the beam limitation aperture image and first and second blanking aperture images by taking differentials between the obtained beam limitation aperture image and each of the first and second blanking aperture images to determine the center position of the beam limitation aperture image.

3. The charged particle beam lithography apparatus according to claim 1, wherein the calculation unit emphasizes contours of the beam limitation aperture image and first and second blanking aperture images by taking differences between the obtained beam limitation aperture image and each of the first and second blanking aperture images to determine the center position of the beam limitation aperture image.

4. The charged particle beam lithography apparatus according to claim 1, wherein a beam limitation aperture is provided in the second illumination lens
wherein the calculation unit calculates amounts of deflection of the first and second deflectors based on the determined center position of each of the beam limitation aperture image and first and second blanking aperture images so that at least one center position of the first and second blanking aperture images corresponds to the center position of the beam limitation aperture image, and
wherein the deflector control unit controls the first and second deflectors based on the calculated amount of deflection.

5. The charged particle beam lithography apparatus according to claim 4, wherein the calculation unit emphasizes contours of the beam limitation aperture image and first and second blanking aperture images by taking differentials between the obtained beam limitation aperture image and each of the first and second blanking aperture images to determine the center position of the beam limitation aperture image.

6. The charged particle beam lithography apparatus according to claim 4, wherein the calculation unit emphasizes contours of the beam limitation aperture image and first and second blanking aperture images by taking differences between the obtained beam limitation aperture image and each of the first and second blanking aperture images to determine the center position of the beam limitation aperture image.

7. The charged particle beam lithography apparatus according to claim 1,
wherein the calculation unit determines a center of gravity of each of the obtained beam limitation aperture image and the first and second blanking aperture images,
wherein the calculation unit calculates third amounts of excitation of the first and second deflectors based on the determined center of gravity of each of the beam limitation aperture image and first and second blanking aperture images so that at least one center position of the first and second blanking aperture images corresponds to the center of gravity of the beam limitation aperture image, and
wherein the deflector control unit controls the first and second deflectors based on the calculated third amounts of excitation.

8. The charged particle beam lithography apparatus according to claim 7, wherein the calculation unit emphasizes contours of the beam limitation aperture image and first and second blanking aperture images by taking differentials between the obtained beam limitation aperture image and each of the first and second blanking aperture images to determine the center of gravity of the beam limitation aperture image.

9. The charged particle beam lithography apparatus according to claim 7, wherein the calculation unit emphasizes contours of the beam limitation aperture image and first and second blanking aperture images by taking differences between the obtained beam limitation aperture image and each of the first and second blanking aperture images to determine the center of gravity of the beam limitation aperture image.

10. The charged particle beam lithography apparatus according to claim 1, wherein a beam limitation aperture is provided in the second illumination lens
wherein the calculation unit determines a center of gravity of each of the obtained beam limitation aperture image and the first and second blanking aperture images,
wherein the calculation unit calculates amounts of deflection of the first and second deflectors based on the determined center of gravity of each of the beam limitation aperture image and first and second blanking aperture images so that at least one center position of the first and second blanking aperture images corresponds to the center of gravity of the beam limitation aperture image, and
wherein the deflector control unit controls the first and second deflectors based on the calculated amounts of deflection.

11. The charged particle beam lithography apparatus according to claim 10, wherein the calculation unit emphasizes contours of the beam limitation aperture image and first and second blanking aperture images by taking differentials between the obtained beam limitation aperture image and each of the first and second blanking aperture images to determine the center of gravity of the beam limitation aperture image.

12. The charged particle beam lithography apparatus according to claim 10, wherein the calculation unit emphasizes contours of the beam limitation aperture image and first and second blanking aperture images by taking differences between the obtained beam limitation aperture image and each of the first and second blanking aperture images to determine the center of gravity of the beam limitation aperture image.

13. A charged particle beam lithography method for performing lithography by irradiating a charged particle beam on a test piece, comprising:
    transmitting a charged particle beam emitted from a charged particle beam generation source through a charged particle beam forming portion, the charged particle beam forming portion being arranged on an optical axis;
    arranging, in the charged particle beam forming portion, a first illumination lens, a beam limitation aperture provided in the first illumination lens, a second illumination lens, a first blanking aperture, a blanking deflector and a second blanking aperture in order from the charged particle beam generation source;
    deflecting the emitted charged particle beam by a first deflector which is arranged between the charged particle beam forming portion and the charged particle beam generation source;
    deflecting, by a second deflector arranged between the first deflector and the charged particle beam forming portion, the deflected charged particle beam;
    obtaining image data of the aperture;
    calculating first amounts of excitation of the first and second deflectors based on the obtained image data of the aperture, so that the charged particle beam is deflected by the first deflector to intersect the optical axis and the deflected charged particle beam is deflected by the second deflector to advance on the optical axis; and
    controlling the first and second deflectors based on the calculated first amounts of excitation;
    obtaining image data indicating reflection of the charged particle beam from the second blanking aperture;
    determining a beam limitation aperture image and first and second blanking aperture images from the obtained image data indicating reflection;
    determining a center position of each of the obtained beam limitation aperture image and the first and second blanking aperture images;
    calculating second amounts of excitation of the first and second deflectors based on the determined center position of each of the obtained beam limitation aperture image and the first and second blanking aperture images so that at least one center position of the first and second blanking aperture images corresponds to the center position of the beam limitation aperture image; and
    controlling the first and second deflectors based on the calculated second amounts of excitation.

14. The charged particle beam lithography method according to claim 13, further comprising:
    emphasizing contours of the obtained beam limitation aperture image and the first and second blanking aperture images by taking differentials between the obtained beam aperture image and each of the first and second blanking aperture images to determine the center position of the aperture image.

15. The charged particle beam lithography method according to claim 13, further comprising:
    emphasizing contours of the obtained beam limitation aperture image and the first and second blanking aperture images by taking differences between the obtained beam aperture image and each of the first and second blanking aperture images to determine the center position of the aperture image.

16. The charged particle beam lithography method according to claim 13, further comprising:
    determining a center of gravity of each of the obtained beam limitation aperture image and the first and second blanking aperture images,
    calculating the amount of deflection of the first and second deflectors based on the determined center of gravity of each of the obtained beam limitation aperture image and the first and second blanking aperture images so that at least one center position of the first and second blanking aperture images corresponds to the center of gravity of the beam limitation aperture image, and
    controlling the first and second deflectors based on the calculated amount of deflection.

17. The charged particle beam lithography method according to claim 16, further comprising:
    emphasizing contours of the obtained beam limitation aperture image and the first and second blanking aperture images by taking differentials between the obtained beam limitation aperture image and each of the first and second blanking aperture images to determine the center of gravity of the beam limitation aperture image.

18. The charged particle beam lithography method according to claim 16, further comprising:
    emphasizing contours of the obtained beam limitation aperture image and the first and second blanking aperture images by taking differences between the obtained beam limitation aperture image and each of the first and second blanking aperture images to determine the center of gravity of the beam limitation aperture image.

* * * * *